United States Patent [19]

Chan

[11] Patent Number: 5,006,575

[45] Date of Patent: Apr. 9, 1991

[54] DIE ATTACH ADHESIVE COMPOSITION

[75] Inventor: Man-Sheung Chan, Aldan, Pa.

[73] Assignee: E. I. Du Pont de Nemours and Company, Wilmington, Del.

[21] Appl. No.: 515,698

[22] Filed: Apr. 26, 1990

Related U.S. Application Data

[63] Continuation-in-part of Ser. No. 425,389, Oct. 20, 1989, abandoned.

[51] Int. Cl.$^5$ ............................................. C08L 63/04
[52] U.S. Cl. ................................... 523/458; 525/930; 252/514
[58] Field of Search .................... 523/458; 525/930; 252/514

[56] References Cited

U.S. PATENT DOCUMENTS

| | | | |
|---|---|---|---|
| 4,479,983 | 10/1984 | Appelt et al. | 427/54.1 |
| 4,516,836 | 5/1985 | Ferrato | 350/336 |
| 4,526,912 | 7/1985 | Biorcio et al. | 525/930 |
| 4,587,038 | 5/1986 | Tamura | 523/458 |
| 4,595,606 | 6/1986 | St. John et al. | 252/514 |
| 4,732,702 | 3/1988 | Yamazaki et al. | 252/514 |
| 4,880,570 | 11/1989 | Sanborn et al. | 523/458 |
| 4,942,190 | 7/1990 | Murayama et al. | 523/458 |

*Primary Examiner*—Paul R. Michl
*Assistant Examiner*—Karen A. Hellender

[57] ABSTRACT

A solid adhesive composition which is suitable for the very rapid attachment of IC chips to high surface energy substrates comprising flake silver particles dispersed in solid matrix consisting essentially of a thermoplastic phenoxy resin and a small amount of thermally crosslinkable resin.

12 Claims, No Drawings

DIE ATTACH ADHESIVE COMPOSITION

CROSS-REFERENCE TO RELATED APPLICATION

This application is a continuation-in-part of co-pending U.S. patent application Ser. No. 07/425,389, filed Oct. 20, 1989, now abandoned.

FIELD OF THE INVENTION

The invention is directed to die attach compositions which are particularly useful for the very rapid attachment of IC chips to high surface energy substrates such as alumina and silicon.

BACKGROUND OF THE INVENTION

Despite the substantial progress made heretofore in the technology of die attach adhesives, there remains a very real need for such adhesives which can not only be applied on line in a very rapid manner, but also at lower temperatures. Furthermore, these new adhesives must be able to withstand higher wire bonding temperatures and be more resistant to moisture.

In the mass production of integrated chip assemblies, a particularly critical step to productivity of the process is the step of bonding the integrated circuit (IC) chip to its substrate. Such substrates include lead frames, pre-molded ceramic packages, pre-molded plastic packages, ceramic substrates and printed wiring boards. Heretofore, this has been done either by bonding the IC chip by means of a eutectic process, inorganic binder or by means of a filled epoxy adhesive. In the latter two cases, the assembly must be removed from the assembly line and processed further in some way. For example, in the case of inorganic binders, the assembly must be fired off-line to effect sintering of the inorganic binder and bonding of the IC chip to the substrate, thus removing the part from the assembly sequence for up to two hours typically and frequently longer. Similarly, in the case of filled epoxy binders, the assembly must be removed from the assembly sequence to allow curing (crosslinking) of the epoxy resin, which may require from several minutes to as much as an hour for completion.

From the foregoing description of the current state of the art, it is evident that there is a very substantial unmet need for a method of bonding IC chips to substrates by which appropriate adhesion of the IC chip to the substrate can be achieved so quickly that "in-line" assembly is possible. The primary objectives of such a process would be to have a bonding system that would result in higher throughput, higher yields, improved device reliability and effectively lower cost.

To achieve these primary objectives, it is necessary that the bonding system meet the secondary objectives of being adaptable to a highly automated in-line process (eliminating off-line processing altogether) by which the mounted IC chip can be conveyed directly and immediately to wire bonding.

New, high-performance polymers, in ribbon form, are now being used for IC attachment. These polymers offer advantages over conventional gold-silicon eutectic and epoxy, polyimide and glass paste processes.

This new generation of adhesives meets or surpasses the fundamental requirements for adhesion, purity, outgassing, conductivity, stress and shelf/machine-life. Clear advantages are realized in higher production-line throughput, increased automation, waste reduction, controlled bondline-thickness, re-workability, void-free bond-lines and higher yield due to the elimination of problems associated with handling pastes such as stringing/tailing and improper dispense quantity.

SUMMARY OF THE INVENTION

The invention in its primary aspect is directed to a solid adhesive composition which is suitable for the very rapid attachment of IC chips to high surface energy substrates at low temperatures comprising (a) 60–80% by weight flake silver particles dispersed in (b) 40–20% by weight of a solid, homogeneous, amorphous polymer, halide-free matrix consisting essentially of 92–99.5% by weight thermoplastic phenoxy resin and 8–0.5% by weight of a thermally crosslinkable resin selected from phenol-formaldehyde, melamine-formaldehyde and mixtures thereof.

In another aspect, the invention is directed to thick film adhesive pastes in which the flake silver particles are dispersed in a solution of the above-described polymers in a non-volatile organic solvent. The invention is also directed to tapes and ribbons formed from the above-described solid adhesive composition. As used herein the term "tape" refers to thin layers of the composition applied to either or both sides of a substrate such as polyester film or polyimide film. The term "ribbon" refers to self-supporting thin layers of the composition usually cut to narrow widths.

PRIOR ART

U.S. Pat. No. 4,516,836, Ferrato

The patent is directed to an electrically conductive material for interconnects comprising a mixture of an epoxy and/or thermoplastic resin and an organic glycol to retain flexibility of the resin.

U.S. Pat. No. 4,479,983, Appelt et al

The Appelt et al patent is directed to a photopolymerizable solder mask composition comprising a phenoxy resin, thickening agent, polyethylenically-unsaturated compound (acrylic or methacrylic monomer), reaction product of an unsaturated carboxylic acid with an epoxy or epoxidized novolac resin and solvent.

DETAILED DESCRIPTION OF THE INVENTION

A. Flake Silver

Finely divided particles of silver are widely used in the electronics industry for the manufacture of thick film pastes which can be used to form conductive circuit patterns in a wide variety of electronic components. In such applications, the thick film pastes are applied by such methods as screen printing and are either dried to remove solvent or dried and fired to effect volatilization of the liquid organic medium from the paste and to effect sintering of the silver particles to form an integral circuit pattern.

Experience in the use of such thick film pastes has taught that conductivity of the final dried and/or fired pastes and thus the specific conductivity of the circuits prepared therefrom can be substantially improved by the use of flake silver particles. For this reason, most of the thick film pastes used throughout the electronics industry employ flake-shaped particles of silver rather than spherical or semi-spherical particles.

Flake silver particles are mainly formed by ball-milling more spherical particles. However, in the ball-milling operations it is necessary in most instances to add to the mass to be milled an amount of surfactant sufficient to prevent the quite maleable silver particles from undergoing cold welding (fusion) as their configuration is changed to flake morphology.

The flake silvers which can be used in the process of the invention are commercial grades which have been milled in admixture with a long-chain fatty acid and which have low concentrations of ionic contaminants in order to meet the long-term reliability requirements of IC chip packaging.

The long-chain moiety of the fatty acid salts will usually be derived from stearic palmitic or lauric acids or mixtures thereof. However, other long fatty acid chains, both natural and synthetic, can be used as well. The most universally used material for this purpose is technical grade sodium stearate, both because of its effectiveness and its comparatively low cost in technical grades. Technical grade sodium stearate is, in fact, a mixture predominating in sodium stearate but also containing smaller amounts of sodium palmitate and sodium laurate. Other suitable long-chain fatty acids include materials such as oleic acid and linoleic acid.

Flake silver is used in the composition of the invention rather than silver powder in order to get the higher degree of electrical and heat conduction which is afforded by the tendency of the silver flakes to overlap when the composition is applied to substrates. The use of silver flakes of larger sizes (10–30 μm) is particularly beneficial in achieving high electrical conductivity at relatively low silver loading.

At least 60% by weight flake silver should be used in order to obtain adequate electrical and thermal conductivity of the adhesive. On the other hand, it is preferred to use no more than 80% by weight silver for the reason that bonding strength may be reduced to an unacceptable level for some applications.

B. Phenoxy Resin

As used herein the term "phenoxy resin" refers to amorphous, high-molecular weight poly(hydroxyethers) derived from the reaction of bisphenols and epichlorohydrin. In particular, the phenoxy resins for use in the composition of the invention correspond to the structural formula

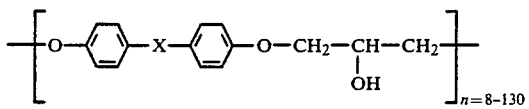

in which X is selected from the following moieties:

| X | Tg, °C. |
|---|---|
| —C(CH₃)₂—CH₂—CH(CH₃)— | 75 |
| —CH₂— | 80 |
| —CH(CH(CH₃)₂)— | 95 |
| —C(CH₃)₂— | 100 |
| —C(CH₃)(C₆H₅)— | 115 |
| —C(CH₃)₂—C₆H₁₀—C(CH₃)₂— | 135 |
| —C₆H₁₀—C(CH₂CH₃)— | 140 |
| —S(=O)(=O)— | 155 |
| dimethyl-cyclohexyl with isopropyl (menthane-type) | 175 |

The last four X moieties listed above when used to make phenoxy resins of this type result in polymers having Tg values above 120° C. which are not suitable by themselves for use in the composition. Nevertheless, such polymers can be used in admixture with phenoxy polymers having lower Tg values so long as the blend is homogeneous and the Tg of the resulting blend does not exceed about 120° C.

The above-described phenoxy resins or blends thereof must have a Tg of 80°–160° C. and a tensile modulus of at least $1 \times 10^5$ psi. Amorphous polymers having a Tg below 80° C. tend to flow during application, while those polymers having higher Tg values do not melt sufficiently to obtain effectively rapid adhesion to the substrates. A Tg range of 100°–120° C. is preferred.

It is essential that the phenoxy resins for use in this invention contain no halide groups of any kind lest traces of halogens interfere with the effectiveness of the compositions in very sensitive electronic circuitry.

The chemistry and method of preparing phenoxy resins of the type used here are described in detail in the *Encyclopedia of Polymer Science and Technology*, Vol. 10, p 111–122 (1964).

C. Thermally Crosslinkable Resin

Suitable thermally crosslinkable resins for use in the composition are phenol-formaldehyde, melamine-formaldehyde and urea-formaldehyde resins. It is preferred to use phenol formaldehyde or melamine formaldehyde resins if processing temperatures exceed about 200° C. since they are more thermally stable.

The phenol-formaldehyde resins are formed by the condensation of an aldehyde and a phenol and the melamine-formaldehyde resins are formed by the condensation of an aldehyde with melamine. Both types of resins are thermosetting.

The most used aldehyde is formaldehyde, although other aldehydes, such as acetaldehyde, can also be employed. Methylene-releasing and aldehyde-releasing agents, such as paraformaldehyde and hexamethylene tetramine, can be utilized as the aldehyde agent if desired.

Various phenols can be used; for instance, the phenol employed can be phenol itself, a cresol, or a substituted phenol in which a hydrocarbon radical having either a straight chain, a branched chain or a cyclic structure is substituted for a hydrogen in the aromatic ring. Mixtures of phenols are also often employed. Some specific examples of phenols utilized to produce these resins include p-phenyl-phenol, p-tert-butylphenol, p-tert-amylphenol, cyclopentylphenyl and unsaturated hydrocarbon-substituted phenols, such as the monobutenyl phenols containing a butenyl group in ortho, meta or para position, and where the double bond occurs in various positions in the hydrocarbon chain. A common phenol resin is phenol formaldehyde.

Particularly preferred types of phenolic resins are heat reactive resole resins made from reactions of phenol with formaldehyde.

The amount of crosslinking resin in the composition must be at least 0.5% by weight in order to get a beneficial degree of crosslinking. In addition, the crosslinking resin also enhances bond strength by promoting wetting of the substrate surface and enhances the water resistance of the bonded adhesive. On the other hand, it is not desirable to use more than about 8% by weight crosslinking resin for the reasons that the adhesive may undergo excess shrinkage and also reduce adhesion. It is preferred to use a 2-6% by weight crosslinking resin.

It should be noted that the small amounts of crosslinking resin used in the invention do not undergo extensive crosslinking for the reasons that they are used in such small amounts and undergo crosslinking conditions for only the brief time during application. They are nevertheless essential components of the invention in order to avoid moisture sensitivity, excessive shrinkage and low strength of the bond.

D. Formulation

The composition of the invention can be formulated in the same manner whether the formulation is intended for making tape or ribbons. A preferred method of formulating the composition of the invention is to dissolve the phenoxy polymer in a polar solvent such as methyl ethyl ketone or toluene or mixtures of the two solvents. Whereas, in a paste preparation the preferred solvents are diacetone alcohol or monomethyl propylene glycol ether which are both low volatile organic solvents. The crosslinking polymer and flake silver are then added to the solution and the admixture is agitated to disperse the silver uniformly in the liquid medium. The amount of solvent will, of course, govern the viscosity of the dispersion. Thus, less solvent will be used to form a thick film paste and more solvent will be used to form a dispersion of sufficiently low viscosity for casting as a tape or ribbon.

When the composition is to be formed as a tape, the flowable dispersion is cast or extruded onto a medium or high surface energy substrate such as a polyimide film, metal foil, or fiber glass fabric. But if it is to be used in ribbon form, it is cast onto a low surface energy substrate such as polypropylene-coated paper or polyester film from which it can be easily released. In both cases, after casting or extrusion, the film is dried by heating the cast film to evaporate the solvent therefrom and thus form the solid matrix of flake silver dispersed in polymer.

EXAMPLES

Example 1

(Phenoxy/Phenol Formaldehyde Adhesive Solution)

A resin solution (Solution A) containing 28% by weight of UCAR ® PKHJ phenoxy resin was prepared by dissolving the PKHJ resin in methyl ethyl ketone (MEK). An adhesive solution was prepared by mixing 400 grams of Solution A with 7 grams of a phenol formaldehyde resin, UCAR ® BRL-2741.

Example 2

(Silver Filled Ribbon Adhesive)

A 20 gram sample of adhesive solution in example 1 was mixed with 13.5 grams of silver flakes having flake size of 5-30 microns, preferably Metz silver flake #25 to a uniform dispersion.

The dispersion was coated on a carrier film (2 mil Mylar ® polyester film or a release paper) using a 8 mil coating knife. The coating was dried in an oven for 5 minutes at 80 degrees C. and then 10 minutes at 150 degrees C. The adhesive coating was peeled off from the carrier film, and then slit into 0.200 inch ribbons.

To test die-bonding, adhesive preforms cut from a ribbon was bonded to 0.200 inch square gold-back silicon dies and silver-spotted lead frames on an automatic die-bonder, (European Semiconductor Equipment Centre, Cham Switzerland). Typical die-bonding conditions are: 250-275 degrees C. bonding temperature, 0.5-1 second bonding time, and 200-350 grams bonding force. Die-bonded parts were tested for die shear strength on a die shear tester, (Hybrid Machine Products Corp., Canon City, Colo.). Typical die shear strength values were 1-1.5 kg/mm sq.

Electrical volume resistivity of adhesive samples were determined by measuring electrical resistance on 2.5 mm wide adhesive strips after a 30 second 250 degrees C. bake or a 30 minute 150 degrees C. bake. Typical resistivity values were $1-3 \times 10^{-4}$ ohm.cm.

Example 3

(Adhesive with Small Silver Flake)

An adhesive dispersion sample same as example 2 was prepared using silver flakes with flake size of 1-10 microns instead of Metz #25 silver. Adhesive ribbon samples were prepared and then tested for die-bonding, die shear strength and electrical resistivity in the same way as example 2. Typical die shear strength values were 0.17-0.6 kg/mm sq. and typical volume resistivity values were $3-6 \times 10^{-4}$ ohm.cm.

Example 4

(Adhesive Containing Epoxy Curing Agent)

An adhesive solution was prepared by mixing 27 grams of adhesive solution of example 1 and 0.4 grams of an epoxy resin, Epon 828. 19.4 grams of silver flake were added to the adhesive solution and then the mixture was mixed to a uniform dispersion. The dispersion was converted into adhesive ribbon samples in the same way as described in example 2. Die-bonding and die shear strength were tested on ribbon samples. Typical die shear strength values were only 0.05-0.3 kg/mm sq.

Example 5

A phenoxy resin solution was prepared by dissolving 15 grams of phenoxy PKHJ in a mixed solvent containing 40 grams of diacetone alcohol and 5 grams of methyl ethyl ketone. 0.9 grams of resole resin UCAR BRL-2741 and 36.8 grams of silver flakes were added to the resin solution and mixed to a uniform paste. Typical viscosity was 75-85 poise (Brookfield LVT viscometer, #3 spindle at 12 rpm; Brookfield Engineering Lab. Inc., Stoughton, Mass., U.S.A.).

Example 6

An adhesive paste, which can be processed at temperature below 150° C., was prepared by a procedure similar to Example 5. 15 grams of phenoxy PKHJ were dissolved in a mixed solvent composed of 17.5 grams of toluene and 17.5 grams of 1-methoxy-2-propanol. 0.9 grams of resole resin and 36.8 grams of silver flakes were added to the resin solution and then mixed to a uniform paste. Typical viscosity of the paste was 65-75 poise.

Glossary

UCAR ® is a tradename of Union Carbide Corporation, Danbury, Conn. for resole resins.

Metz 25 is a trade designation of Metz Metallurgical, South Plainfield, N.J. for flake silver.

Mylar ® is a trademark of E. I. du Pont de Nemours & Co., Inc., Wilmington, Del. for polyester film.

Epon ® is a trademark of Shell Chemical Co., Houston, Tex. for epoxy resins.

I claim:

1. An adhesive composition for attaching IC chips to high surface energy inorganic substrates comprising:
   (a) 60-80% by weight of flake silver particles dispersed in
   (b) 40-20% by weight of a solid, homogeneous, amorphous polymeric halide-free matrix consisting essentially of 92-99.5% by weight thermoplastic phenoxy resin and 8-0.5% by weight thermally crosslinkable resin, the polymeric matrix having a Tg of 80°-160° C. and a tensile modulus of at least $1.0 \times 10^5$ psi.

2. The composition of claim 1 in which component (a) is 65-75% by weight flake silver.

3. The composition of claim 1 in which the thermally crosslinkable resin is a heat-reactive resole resin.

4. The composition of claim 1 containing 6 to 2% by weight of the thermally crosslinkable resin.

5. The composition of claim 1 in which the thermally crosslinkable resin is a melamine-formaldehyde resin.

6. The composition of claim 1 in which the phenoxy resin corresponds to the structural formula

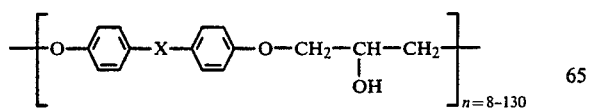

in which X is selected from the group consisting of:

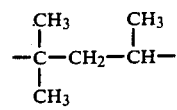

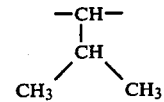

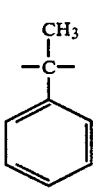

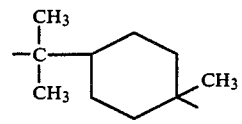

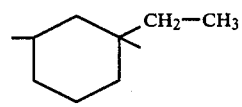

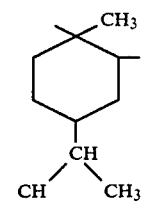

7. The composition of claim 5 in which X is

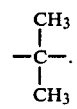

8. The composition of claim 5 in which X is

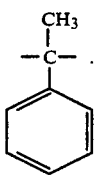

9. The composition of claim 5 in which X is

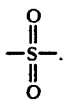

10. The composition of claim 1 in which the Tg of the polymeric matrix is 100°–120° C.

11. The composition of claim 1 in the form of a self-supporting ribbon.

12. A thick film paste composition comprising
(a) 60–80% by weight of finely divided flake silver particles dispersed in
(b) 40–20% by weight of a solid, homogeneous, amorphous polymeric halide-free matrix consisting essentially of 92–99.5% by weight thermoplastic phenoxy resin and 8–0.5% by weight thermally crosslinkable resin, the polymeric matrix having a Tg of 80°–160° C. and a tensile modulus of at least $1.0 \times 10^5$ psi dissolved in a nonvolatile organic solvent.

* * * * *

UNITED STATES PATENT AND TRADEMARK OFFICE
CERTIFICATE OF CORRECTION

PATENT NO. : 5,006,575
DATED : April 9, 1991
INVENTOR(S) : Man-sheung Chan

It is certified that error appears in the above-indentified patent and that said Letters Patent is hereby corrected as shown below:

```
Column 8, Claim 7, line 50, change the number "5" to --6--.
         Claim 8, line 58, change the number "5" to --6--.
         Claim 9, line 68, change the number "5" to --6--.
```

Signed and Sealed this

Twenty-second Day of November, 1994

Attest:

BRUCE LEHMAN

*Attesting Officer*  *Commissioner of Patents and Trademarks*